United States Patent [19]

Mura et al.

[11] Patent Number: 5,272,595
[45] Date of Patent: Dec. 21, 1993

[54] TERMINAL STRUCTURE FOR AN ELECTRONIC DEVICE

[75] Inventors: Hideo Mura, Hakui; Koichi Nagano, Ishikawa; Toshikazu Ishiguro, Hakui, all of Japan

[73] Assignee: Murata Manufacturing Co., Ltd., Japan

[21] Appl. No.: 999,456

[22] Filed: Dec. 29, 1992

Related U.S. Application Data

[63] Continuation of Ser. No. 642,406, Jan. 17, 1991, abandoned.

[30] Foreign Application Priority Data

| Mar. 5, 1990 | [JP] | Japan | 2-53986 |
| Mar. 5, 1990 | [JP] | Japan | 2-53987 |
| Mar. 5, 1990 | [JP] | Japan | 2-54705 |

[51] Int. Cl.$^5$ .................................... H01R 9/00
[52] U.S. Cl. ......................... 361/772; 361/679; 361/807; 361/809; 361/810
[58] Field of Search .................... 333/186–192; 357/68, 70; 361/380, 392, 394, 395, 400, 404–406, 408, 412–413, 421

[56] References Cited

U.S. PATENT DOCUMENTS

| 2,898,520 | 8/1959 | Sterner | 361/406 |
| 3,585,333 | 6/1971 | Valle et al. | 361/408 |
| 3,611,249 | 10/1971 | Lovrenich | 361/408 |
| 3,617,980 | 11/1971 | Alkire | 361/408 |
| 4,323,865 | 4/1982 | Tanaka et al. | 333/187 |
| 4,362,353 | 12/1982 | Cobaugh et al. | 361/405 |
| 4,682,829 | 7/1987 | Kunkle et al. | 361/408 |

FOREIGN PATENT DOCUMENTS

| 0327860 | 1/1989 | European Pat. Off. |
| 2-32232 | 2/1990 | Japan |
| 2-32233 | 2/1990 | Japan |

*Primary Examiner*—Gregory D. Thompson
*Attorney, Agent, or Firm*—Heller, Ehrman, White & McAuliffe

[57] ABSTRACT

A terminal structure for an electronic device, which can be affixed to a resin case while the latter is being molded, has planar base member having a raised portion at least on one of its surfaces. A protruding piece is provided on the same surface so as to protrude therefrom higher than the raised portion. This protruding piece may be a tab which is cut out from the base member and bent therefrom, or another planar plate which overlaps the base member.

13 Claims, 8 Drawing Sheets

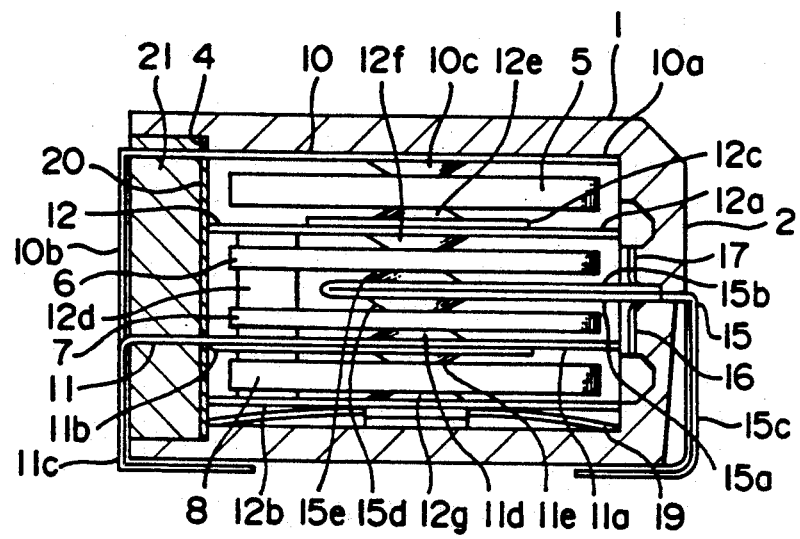

TERMINAL STRUCTURE FOR AN ELECTRONIC DEVICE

This is a continuation of application Ser. No. 07/642,406 filed Jan. 17, 1991, now abandoned.

BACKGROUND OF THE INVENTION

1. Field of the Invention

The present invention relates to a terminal structure for an electronic device such as a ladder filter or a capacitive oscillator, which is made by encasing stacked electronic elements and terminals.

2. Description of Related Art

In a conventional way of making an electronic device such as a ladder filter, a capacitive oscillator, etc., necessary piezoelectric elements and terminals are arranged in a resin frame to be unified, and the unit is mounted in a box-type case which is shallow. This way has such drawbacks as a resin frame is necessary and as the assembly is complicated. Also, since all the terminals protrude their connecting portions from a peripheral surface of the case, the electronic device is mounted on a circuit board with the periphery surface down, which is unstable.

In another well-known way of making an electronic device, a terminal for connecting electronic elements arranged inside the device with an external appliance is inserted into a mold of a resin case so that the terminal will be fixed to the case when the resin is molded into the case. The terminal has a projection which will be a contact point with the electronic elements, and this projection makes it difficult to telease the case and terminal from the mold. If a cavity is made in the mold at a place where the terminal will be put, melted resin will flow into the cavity. If something is attached to the mold at the inlet of the cavity in order to prevent the resin from flowing into the cavity, the projection of the terminal will be caught on the thing when the case and terminal are to be released from the mold.

SUMMARY OF THE INVENTION

It is therefore an object of the present invention to provide a terminal structure for an electronic device which is suitable for being fitted in the resin case.

In order to attain the objects above, an electronic device according to the present invention comprises a box-type case which has an open side, a first terminal fixed to the case simultaneously with molding the case so that a connecting portion of the first terminal protrudes from a side opposite the open side, electronic elements inserted in the case through the open side, a second terminal inserted in the case through the open side, and resin for closing the open side of the case.

The first terminal may be an earth terminal, and the earth terminal is affixed to the case substantially in the center of the case. The second terminal may be an input terminal or an output terminal, and such a terminal is inserted in the case so that the terminal and piezoelectric elements will be arranged one upon another in the case. Thus, a ladder filter having an equivalent circuit as shown in FIG. 7 is produced. According to the present invention, no resin frames are required, and an electronic device such as a ladder filter can be assembled easily. Also, if the connecting portions of the terminals are bent to be extended along sides toward the bottom of the case, the electronic device can be mounted on a circuit board with the bottom (a large surface) down, which will increase the stability of the mounting.

Preferably, the connecting portions of the first terminal and the second terminal bent along sides of the case toward the bottom of the case are further bent to be extended in parallel to the bottom. This arrangement enables surface mounting of the electronic device on a circuit board.

A method of molding a resin case for an electronic device and simultaneously fixing a terminal having at least one projecting contact piece on one side and a connecting portion to the case, according to the present invention, comprises the steps of providing the terminal with a protrusion protruding from the side where the contact piece is disposed, between the contact piece and the connecting portion, which protrusion has a height equal to or larger than the height of the contact piece, placing the terminal in a mold so that the protrusion is in contact with an edge of the part of the mold enclosing the contact piece of the terminal, and injecting melted resin into the mold.

In the method, the protrusion of the terminal closes the part of the mold enclosing the projected part of the terminal. Because the protrusion is equal to or higher than the contact piece the protrusion prevents the resin injected into the mold from flowing toward the contact piece, while the contact piece is not buried in the mold. Consequently, the case and terminal can be released from the mold smoothly. This method makes it easy to fix a terminal to a case while the case is being molded.

The protrusion of the terminal to be fixed to the case may be a tab cut out of the terminal. When the thickness of a plate which is the material of the terminal is equal to or larger than the height of the contact piece, the plate should be cut into the terminal so that the terminal has an extension extending sideward. and the extension is folded back so that the folded part will function as a stopper of resin.

A terminal according to the present invention is composed of a first part having at least one projecting contact piece on one side, and a second part which is stuck on the side of the first part where the contact piece is disposed. The terminal must be made of a plate having a thickness equal to or larger than the height of the contact piece on the first part.

In fixing the terminal to a resin case simultaneously with molding the case, the edge of the second part which is on the first part is contacted with an edge of the part of the mold enclosing the first part. In this state, when melted resin is injected into the mold, the resin is prevented from flowing toward the first part. When the case and the terminal are released from the mold after the resin hardens, the contact piece on the first part is never caught on the mold because the second part stuck on the first part which functioned as a stopper of the resin has a thickness equal to or larger than the height of the contact piece.

BRIEF DESCRIPTION OF THE DRAWINGS

These and other objects of the present invention will be apparent from the description taken in conjunction with the embodiments in reference to the accompanying drawings wherein:

FIGS. 1 through 9 show a first embodiment of the present invention:

FIG. 1 is an exploded view of an electronic device;

FIG. 2 is a cross sectional view of the electronic device;

FIG. 3 is a plan view of an earth terminal;

FIG. 4 is a front view of the earth terminal;

FIG. 5 is a right side view of a case to which the terminal is affixed;

FIG. 6 is a sectional view of the case shown in FIG. 5 crossed in the center;

FIG. 7 is a diagram showing the equivalent circuit of the electronic device;

FIG. 8 is a cross sectional view of the case and terminals showing a modification of the terminals;

FIG. 9 is a cross sectional view of a mold of the case;

DETAILED DESCRIPTION OF THE PREFERRED EMBODIMENTS

Preferred embodiments of the present invention are hereinafter described in reference to the accompanying drawings. In the embodiments, the present invention is applied to a ladder filter.

Figure 1:
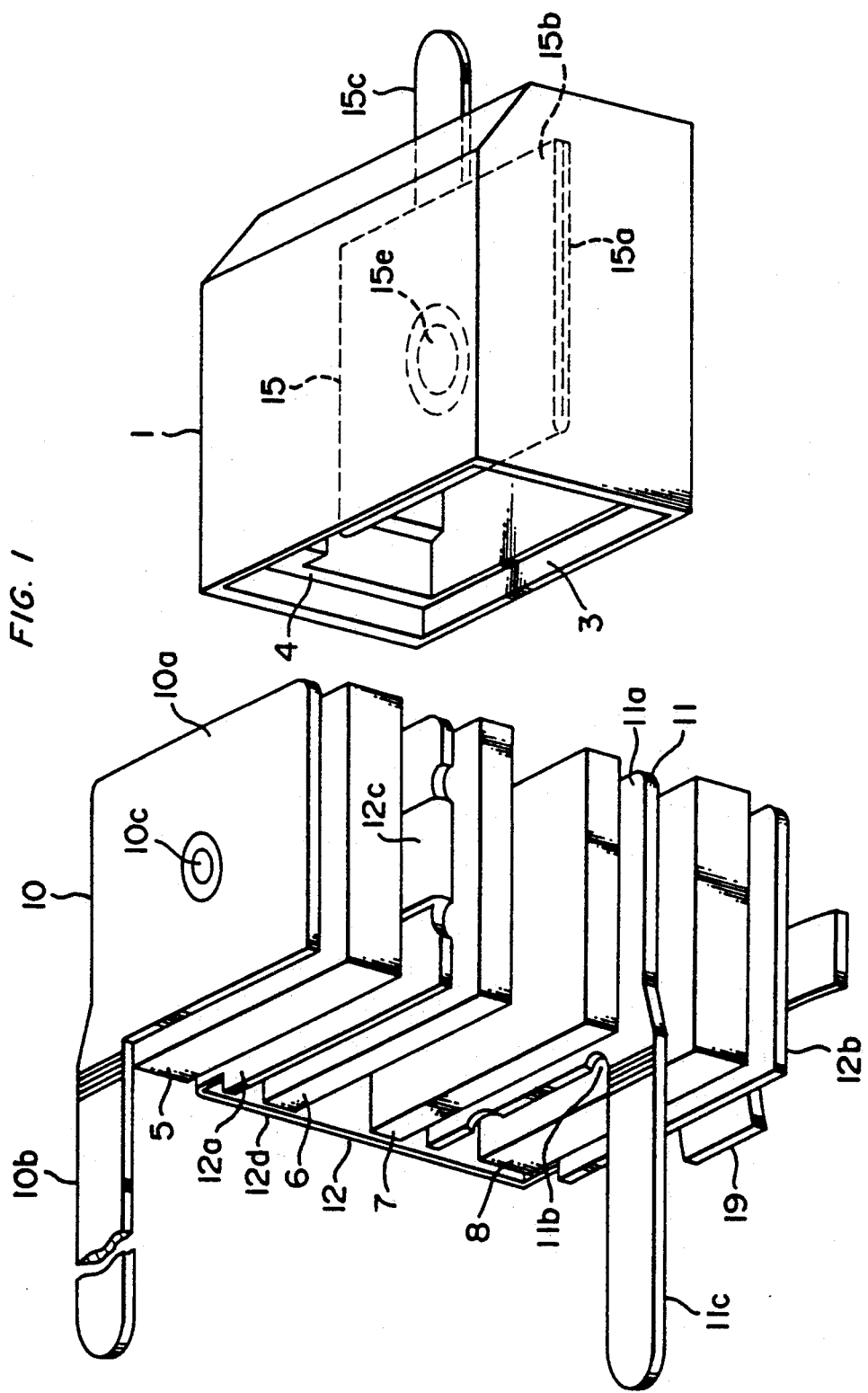

Referring to FIGS. 1 and 2, the ladder filter comprises a case 1, four piezoelectric elements 5, 6, 7 and 8, an input terminal 10, an output terminal 11, a relay terminal 12, an earth terminal 15 and a spring plate 19 in the shape of a cross. The piezoelectric elements 5, 6, 7 and 8 have electrodes on the both surfaces as known.

The input terminal 10 comprises a contact plate 10a, a connecting portion 10b, and a projection 10c which is in contact with the upper surface of the piezoelectric element 5. The output terminal 11 comprises a double-folded contact plate (whose upper layer is numbered 11a and lower layer is numbered 11b in the drawings), a connecting portion 11c, and projections 11d and 11e. The projection 11d is in contact with the lower surface of the piezoelectric element 7, and the projection 11d is in contact with the upper surface of the piezoelectric element 8. The relay terminal 12 comprises a double-folded contact plate (whose upper layer is numbered 12c and lower layer is numbered 12a in the drawings), a contact plate 12b, a relay part 12d and three projections 12e, 12f and 12g. The projection 12e is in contact with the lower surface of the piezoelectric element 5, the projection 12f is in contact with the upper surface of the piezoelectric element 6, and the projection 12g is in contact with the lower surface of the piezoelectric surface 8.

The earth terminal 15 comprises a double-folded contact plate (whose upper layer is numbered 15a and lower layer is numbered 15b in the drawings), a connecting portion 15c and two projections 15d and 15e. This terminal 15 is inserted in a mold of the case 1, and when the case is molded, the terminal 15 is fixed to a wall 2 of the case 1. The projection 15d of the earth terminal 15 is in contact with the upper surface of the piezoelectric element 7, and the projection 15e is in contact with the lower surface of the piezoelectric element 6. FIGS. 3 and 4 show details of the earth terminal 15. The layers 15a and 15b have cutout tabs 16 and 17 respectively. When the terminal 15 is inserted into the mold of the case 1 to be fixed to the case 1, which mold has a cavity which will make it easy to release the case 1 and the terminal 15 from the mold in spite of the projections 15d and 15e, the tabs 16 and 17 will prevent resin from flowing into the cavity toward the projections 15d and 15e.

Figure 9:
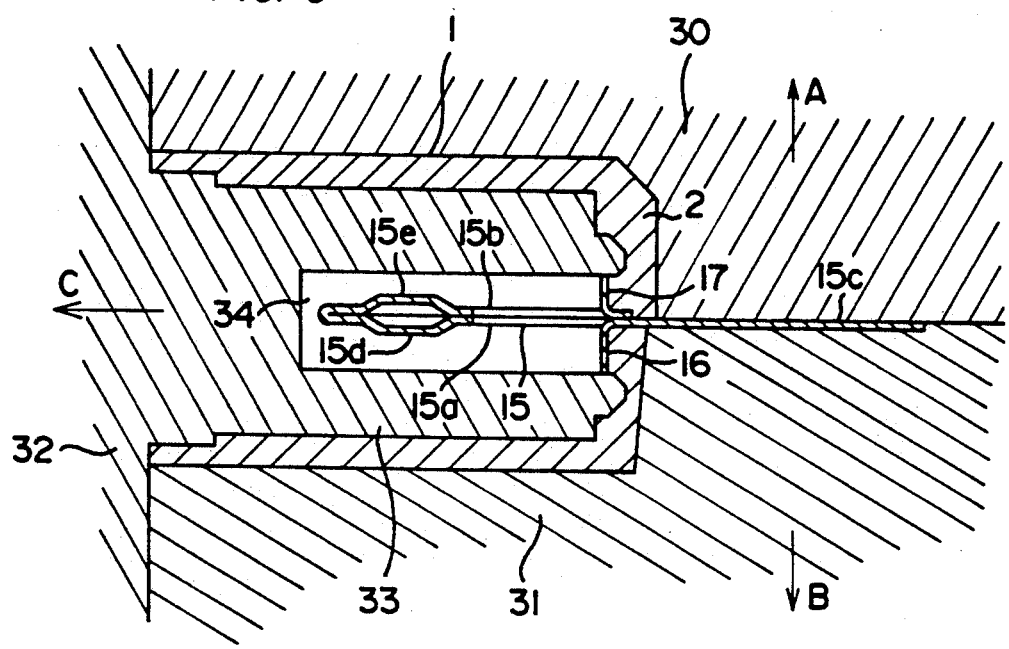

Now referring to FIG. 9, a process of molding the case 1 is described.

The mold is divided into three parts 30, 31 and 32 which will come apart in the directions A, B and C respectively. A cavity 34 into which the double-folded contact plate of the terminal 15 is to be put is formed in a core 33 of the part 32 of the mold. The height of the cavity 34 is larger than the thickness of the bulge (where the projections 15d and 15e are formed) of the terminal 15 and equal to the thickness of the portion where the tabs 16 and 17 are protruding from the both sides of the terminal 15. The width of the cavity 34 is larger than the diameter of the projections 15d and 15e and smaller than the width of the tabs 16 and 17. The tabs 16 and 17 are in contact with the wall of the cavity 34 and close the cavity 34. In this state, the tabs 16 and 17 prevent melted resin injected into the mold from flowing into the cavity 34. When the resin hardens, the case 1 is molded, and simultaneously the earth terminal 15 is fixed to the case 1.

Figure 5:
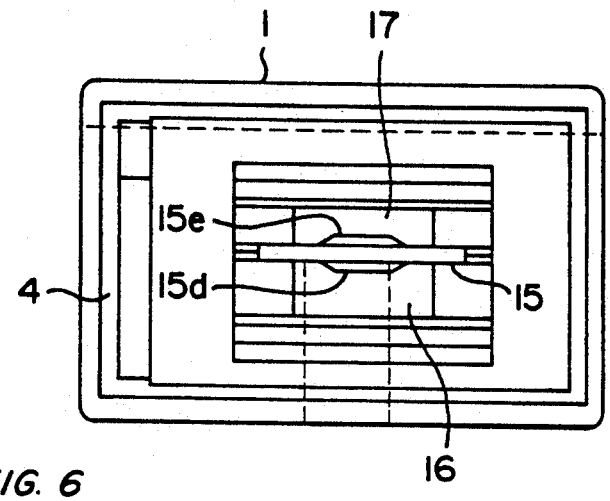
Figure 6:
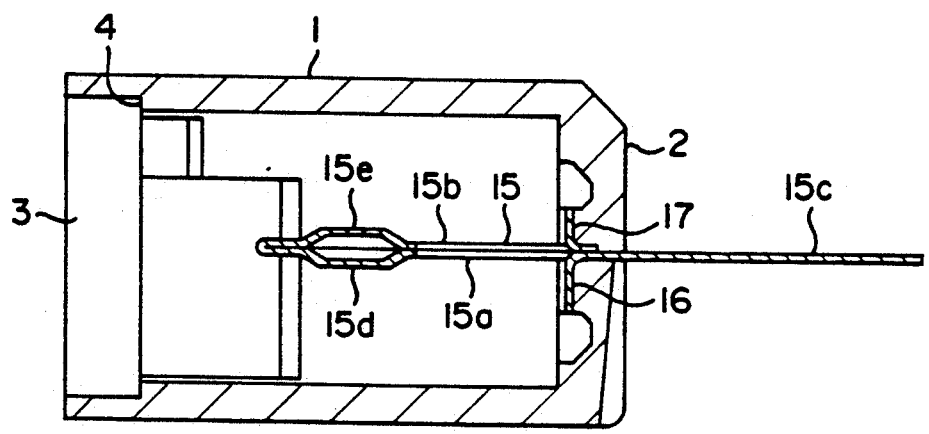
Figure 7:
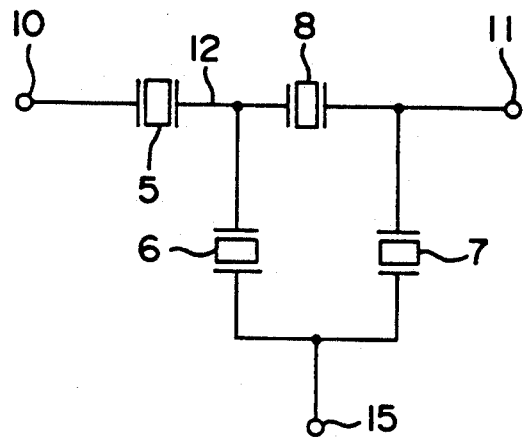

FIGS. 5 and 6 show the case 1 holding the earth terminal 15. The piezoelectric elements 5, 6, 7 and 8, the terminals 10, 11 and 12, and the spring plate 19 are inserted into the case 1 through an open side 3. Thereafter, an insulating sheet 20 is put on a step 4 of the case 1, and the open side 3 is closed by pouring resin 21 in order to shield the interior of the case 1.

Figure 8:
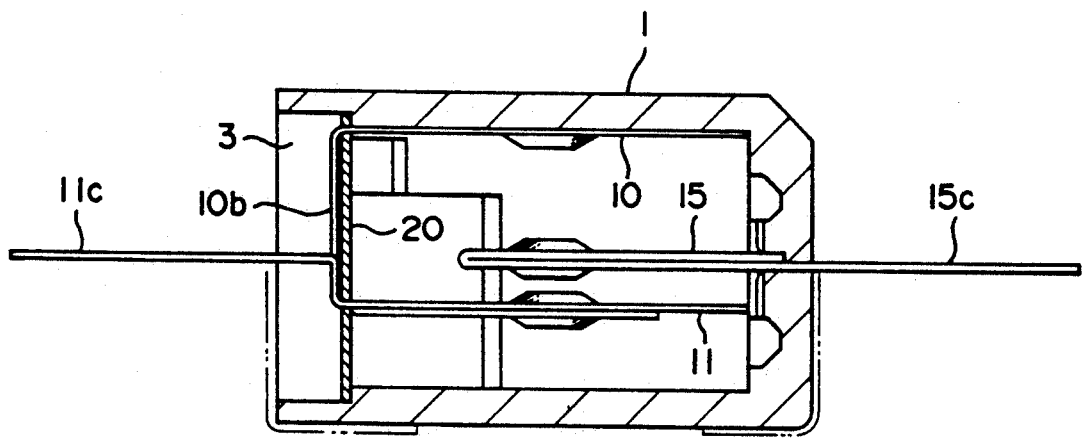

The connecting portions 10b, 11c and 15c of the respective terminals 10, 11 and 15 are bent along the sides and the bottom of the case 1 (see FIG. 2) after the resin 21 hardened. In respect to the bending operation, it is preferable that the terminals 10, 11 and 15 extend the respective connecting portions 10b, 11c and 15c on a level outside the case 1. For this reason, the terminal 10 and 11 are bent inside the case 1 as shown in FIG. 8 to extend the respective connecting portions 10b and 11c on the same level as the terminal 15. Further, it is possible to bend the connecting portions 10b, 11c and 15c outward at the bottom of the case 1 as well as to bend the connecting portions 10b, 11c and 15c inward along the bottom of the case 1.

Figure 10:
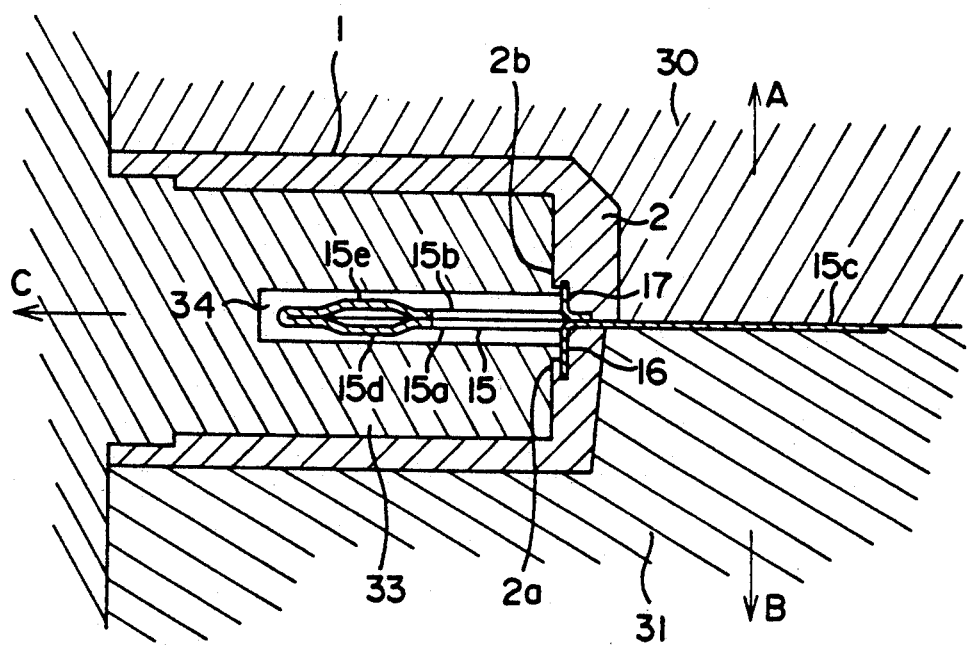
FIG. 10 is a cross sectional view of a modified mold of the case.

The case 1 may be so made that the tabs 16 and 17 of the earth terminal 15 are showing on the inner surface of the case 1. However, if the tabs 16 and 17 are hidden in a step made in the wall of the case 1, the earth terminal 15 will be more insulated from the other terminals and piezoelectric elements. Specifically, as shown in FIG. 10, the cavity 34 is made thinner, and the terminal 15 is inserted in the mold so that the tabs 16 and 17 are in contact with the edge of the core 33 of the mold. Because the cavity 34 is thinner, resin injected into the mold comes over the tabs 16 and 17 as indicated by numerals 2a and 2b. Thereby, the tabs 16 and 17 prevent the melted resin from flowing into the cavity 34, and insulation of the terminal 15 from the other piezoelectric elements and the terminals will be increased.

The height of the cavity 34 is at least equal to the thickness of the bulge (where the projections 15d and 15e are formed) of the terminal 15, and the tabs 16 and 17 should have at least the same heights as the projections 15d and 15e respectively.

Figure 11:
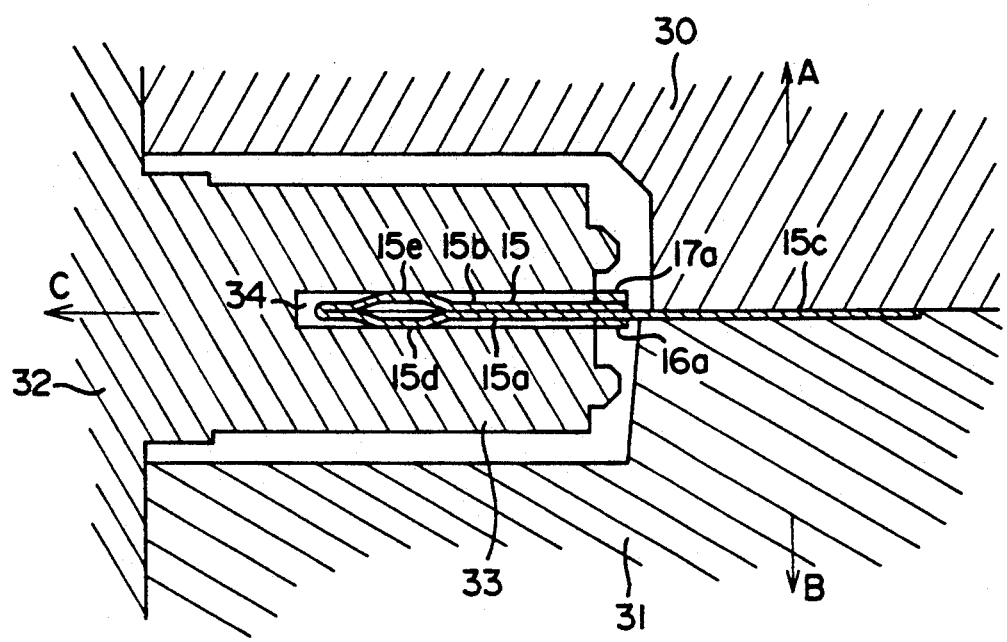
FIG. 11 is a cross sectional view of a mold of the case and a terminal inserted in the mold according to a second embodiment.
Figure 12:
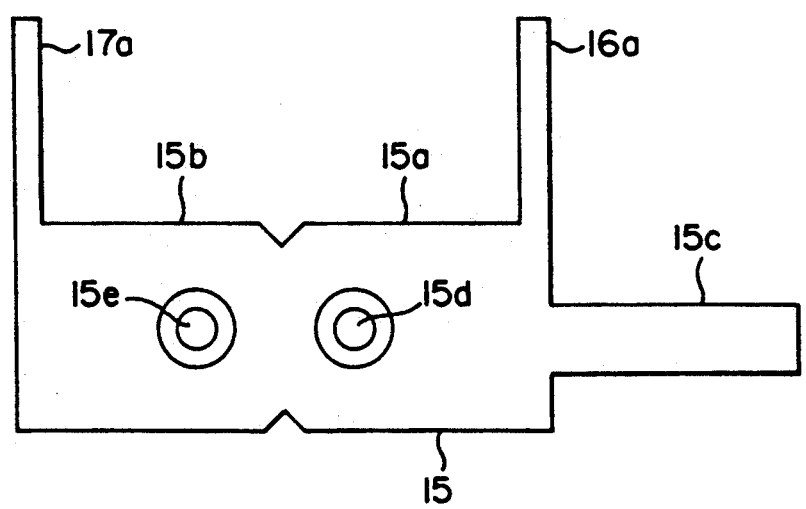
FIG. 12 is a development of the terminal shown in FIG. 11.

The projections 15d and 15e are both 0.05-0.1 mm high, and the thickness of a plate which is the material of the earth terminal 15 is 0.1-0.15 mm. The earth terminal 15 may be so constructed that the layers 15a and 15b of the contact part have extensions 16a and 17a respectively as shown in FIG. 12 and that the extensions 16a and 17b are folded back. The folded parts 16a and 17a take the place of the tabs 16 and 17 as stoppers. In this case, the mold of the case 1 is as shown in FIG. 11, and the folded parts 16a and 17a contact with the edge of the core 33 of the mold and close the cavity 34. Thus, melted resin injected into the mold cannot flow into the cavity 34.

In the process of molding the case 1, the mold is not limited to the three-part type. Also, the earth terminal 15 may have only one projection either 15d or 15e on one side of the contact part.

Figure 13:
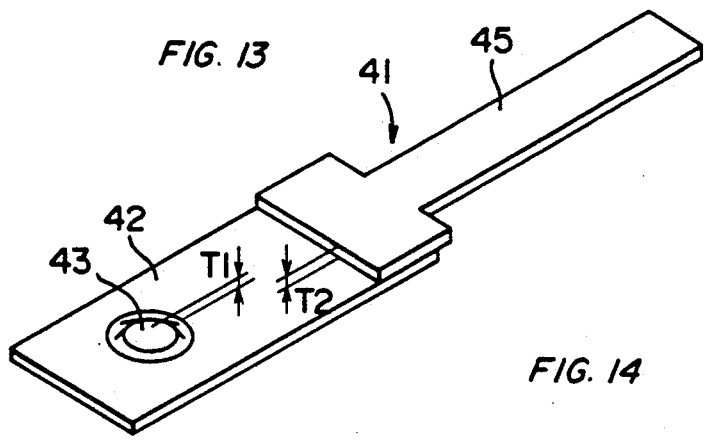
FIG. 13 is a perspective view of a terminal according to a third embodiment.
Figure 14:
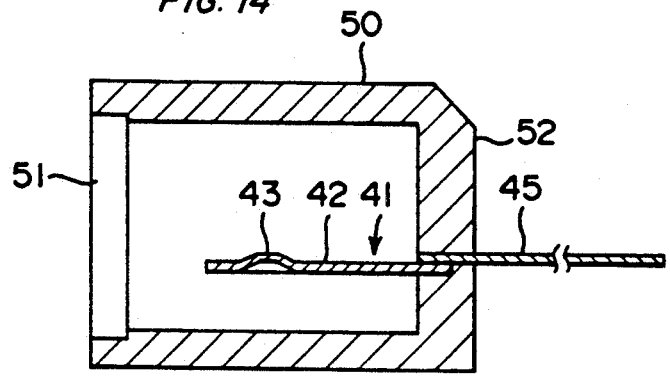
FIG. 14 is a cross sectional view of a case to which the terminal is affixed.
Figure 15:
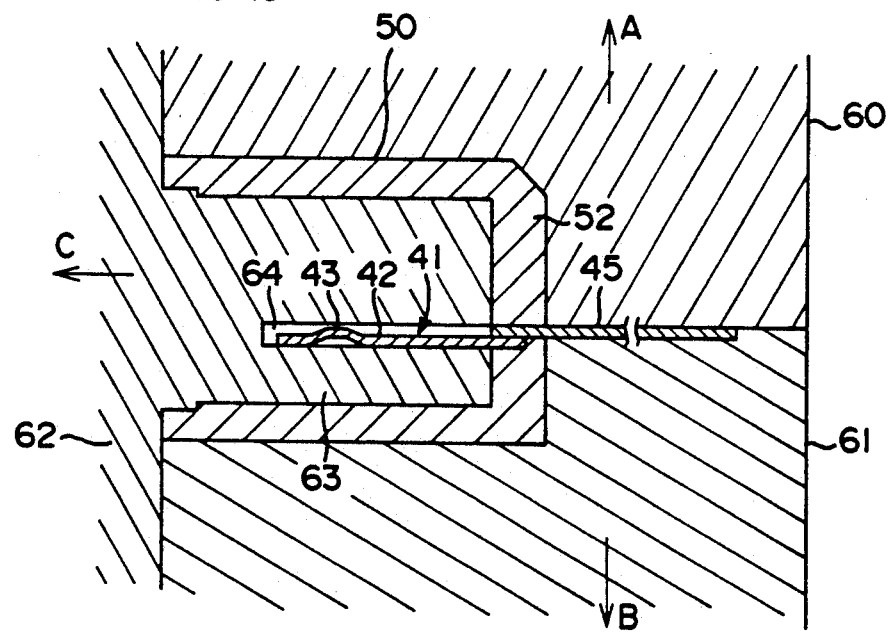
FIG. 15 is a cross sectional view of a mold of the case and the terminal inserted into the mold.

FIGS. 13, 14 and 15 show another process of molding a case 50 and simultaneously fixing a terminal 41 to the case 50.

Referring to FIG. 13, the terminal 41 is composed of a first part 42 having a projection 43 and a second part 45. The first part 42 and the second part 45 overlap so that the second part 45 is put on the side of the first part 42 where the projection 43 is formed. A plate which is 0.1-0.15 mm thick is cut in these parts 42 and 45, and the height of the projection 43 is 0.05-0.1 mm. The plate to be made into the terminal 41 should have a thickness equal to or larger than the height of the projection 43.

The terminal 41 is fixed to the case 50 as shown in FIG. 14 as resin injected into the mold hardens. Piezoelectric elements and other terminals (not shown) are inserted into the case 50 through an open side 51, and the open side 51 is closed by pouring resin. Thus, an electronic device such as a ladder filter, a capacitive oscillator, etc. is produced.

FIG. 15 shows a process of molding the case 50.

The mold is divided into three parts 60, 61 and 62 which will come apart in the directions of A, B and C, respectively. In a core 63 of the mold part 62 is formed a cavity 64 into which the first part 42 of the terminal 41 is to be put. The height of the cavity 64 is equal to the thickness of the overlapping portion of the first part 42 and the second part 45 so that the first part 42 of the terminal 41 will never be stuck in the cavity 64 due to the projection 43. The width of the cavity 64 is larger than the diameter of the projection 43 and smaller than the width of the first part 42. The edge of the second part 45, which edge is on the first part 42, contacts with the edge of the core 63, that is, the cavity 64 is closed by the second part 45 of the terminal 41. Then, melted resin is injected into the mold, and the overlapping portion of the terminal 41 prevents the resin from flowing into the cavity 64. Thus, the case 50 is molded, and simultaneously the terminal 41 is fixed to the case 50.

The larger the area where the second part 45 of the terminal 41 contacts with the core 63 is, the more certainly the second part 45 prevents the resin from flowing into the cavity 64. For this reason, it is preferable that the upper end portion 45b of the second part 45 is buried in the core 63 as shown in FIG. 16.

Figure 16:
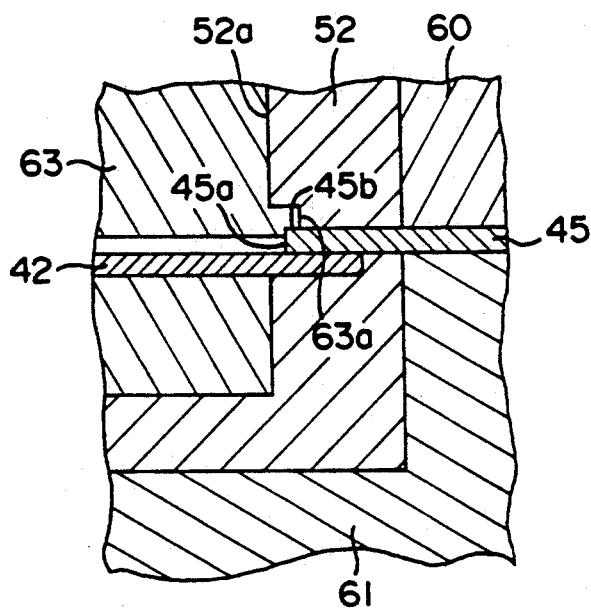
FIG. 16 is a cross sectional view of a modified mold of the case and the terminal inserted into the mold.

Fixing the terminal 41 to the case 50 so as to retreat the edge 45a of the second part 45 from the inner surface 52a of the case 50 as shown in FIG. 16 will decrease the possibility that the other elements to be arranged in the case 50 may contact the second part 45 of the terminal 41.

Figure 17:
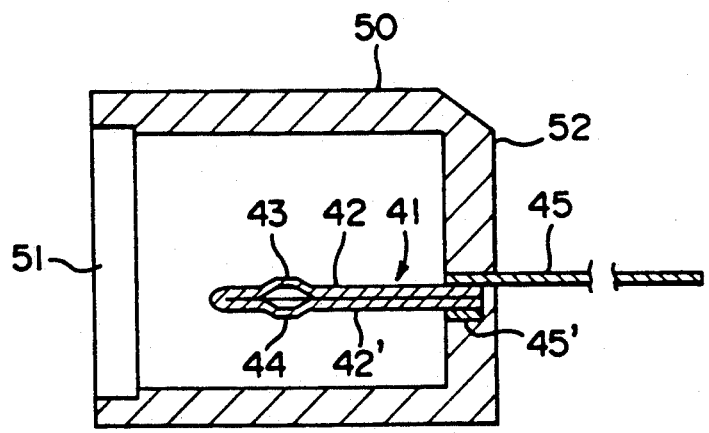
FIG. 17 is a cross sectional view of a case to which a terminal according to a fourth embodiment is affixed.

Referring to FIG. 17, the first part 42 of the terminal 41 has two projections 43 and 44 protruding from either side. More specifically, the plate is cut double as long as the part 42, and the projection 44 is formed on the extended part 42'. The extended part 42' is folded back under the part 42. In this case, a strip of the plate 45' stuck on the end of the part 42' functions as a stopper of the melted resin like the second part 45 of the terminal 41.

The mold to be used in this embodiment is not limited to the three-part type.

What is claimed is:

1. A terminal structure for an electronic device, said structure comprising:
   a generally planar base member having two major surfaces, said base member comprising a single plate which is completely folded back so as to double up and make a surface-to-surface contact with itself;
   a raised portion for supporting an electronic element, said raised portion projecting normally from one of said two major surfaces to a height from said base member; and
   a protruding piece which protrudes from said one of said major surfaces at least by said height.

2. The terminal structure of claim 1 wherein said protruding piece comprises a tab which is cut out of said plate and bent therefrom.

3. The terminal structure of claim 1 wherein the thickness of said plate is greater than said height of said raised portion from said one major surface and wherein said protruding piece is unistructurally formed with and folded from said plate.

4. A terminal structure for an electronic device, said structure comprising:
   a generally planar base member having two major surfaces, said base member comprising a single plate which is completely folded back so as to double up and make a surface-to-surface contact with itself;
   raised portions each adapted to support an electronic element, said raised portions projecting normally from said two major surfaces to a height from said base member; and
   protruding pieces which protrude from said two major surfaces at least by said height.

5. The terminal structure of claim 4 wherein the thickness of said plate is greater than said height of said raised portions from said base member and wherein said protruding pieces are unistructurally formed with and folded from said plate.

6. A terminal structure for an electronic device, said structure comprising:
   a generally planar base member having two major surfaces;
   a raised portion for supporting an electronic element, said raised portion projecting normally from one of said two major surfaces to a height from said base member; and
   a planar piece which at least partially overlaps said base member and protrudes from said one major surface at least by said height.

7. The terminal structure of claim 6 wherein said base member comprises a single plate which is completely folded back so as to double up and make a surface-to-surface contact with itself.

8. The terminal structure of claim 7 wherein said plate has an extended part which is folded onto the other of said two major surfaces of said base member.

9. The terminal structure of claim 6 wherein said planar protruding piece and said base member are 0.1–0.15 mm in thickness, and said height of said raised portion is 0.05–0.1 mm.

10. A terminal structure for an electronic device, said structure comprising:

a generally planar base member having two major surfaces;

raised portions each adapted to support an electronic element, said raised portions projecting normally from said two major surfaces to a height from said base member; and a planar piece which at least partially overlaps said base member and protrudes from one of said two major surfaces at least by said height.

11. The terminal structure of claim 10 wherein said base member comprises a single plate which is completely folded back so as to double up and make a surface-to-surface contact with itself 12. The terminal structure of claim 11 wherein said plate has an extended part which is folded onto the other of said two major surfaces of said base member.

13. The terminal structure of claim 10 wherein said planar piece and said base member are 0.1–0.15 mm in thickness, and said height of said raised portions is 0.05–0.1 mm.

* * * * *